(12) United States Patent
Ito et al.

(10) Patent No.: US 8,307,260 B2
(45) Date of Patent: *Nov. 6, 2012

(54) MEMORY APPARATUS AND METHOD USING ERASURE ERROR CORRECTION TO REDUCE POWER CONSUMPTION

(75) Inventors: Yutaka Ito, Tokyo (JP); Adrian J. Drexler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/365,064

(22) Filed: Feb. 2, 2012

(65) Prior Publication Data

US 2012/0131419 A1    May 24, 2012

Related U.S. Application Data

(63) Continuation of application No. 12/014,598, filed on Jan. 15, 2008, now Pat. No. 8,117,519.

(51) Int. Cl.
*G11C 29/00* (2006.01)

(52) U.S. Cl. ........ 714/764; 714/776; 714/758; 714/761; 714/752; 714/766; 714/753; 714/763; 714/759; 714/799; 714/746; 711/105; 365/229; 365/227; 365/222; 365/185.09

(58) Field of Classification Search .................. None
See application file for complete search history.

(56) References Cited

U.S. PATENT DOCUMENTS

| | | | | |
|---|---|---|---|---|
| 6,697,992 | B2* | 2/2004 | Ito et al. | 714/763 |
| 7,216,198 | B2* | 5/2007 | Ito et al. | 711/106 |
| 7,373,585 | B2* | 5/2008 | Yedidia et al. | 714/786 |
| 7,539,926 | B1* | 5/2009 | Lesea | 714/776 |
| 8,117,519 | B2* | 2/2012 | Ito et al. | 714/764 |
| 2005/0229076 | A1* | 10/2005 | Riho et al. | 714/758 |
| 2005/0283704 | A1* | 12/2005 | Ito et al. | 714/753 |
| 2006/0256615 | A1* | 11/2006 | Larson | 365/185.09 |
| 2008/0104479 | A1* | 5/2008 | Lablans | 714/757 |
| 2008/0282098 | A1* | 11/2008 | Ito et al. | 713/320 |
| 2009/0183053 | A1 | 7/2009 | Ito et al. | |

* cited by examiner

*Primary Examiner* — John Trimmings
(74) *Attorney, Agent, or Firm* — Dorsey & Whitney LLP

(57) ABSTRACT

Data bits stored in memory cells are recognized by an ECC generator as data bit strings in a first direction and data bit strings in a second direction such that each data bit string in the first direction and each data bit string in the second direction share one data bit in common. The ECC controller identifies a data bit string in the first direction having more than one data bit in error based on a respective correction code in the first direction and identifies a data bit string in the second direction having more than one data bit in error based on a respective correction code in the second direction, and causes the data bit shared by the identified data bit string in the first direction and the identified data bit string in the second direction to be changed.

21 Claims, 14 Drawing Sheets

CONTINUED ON

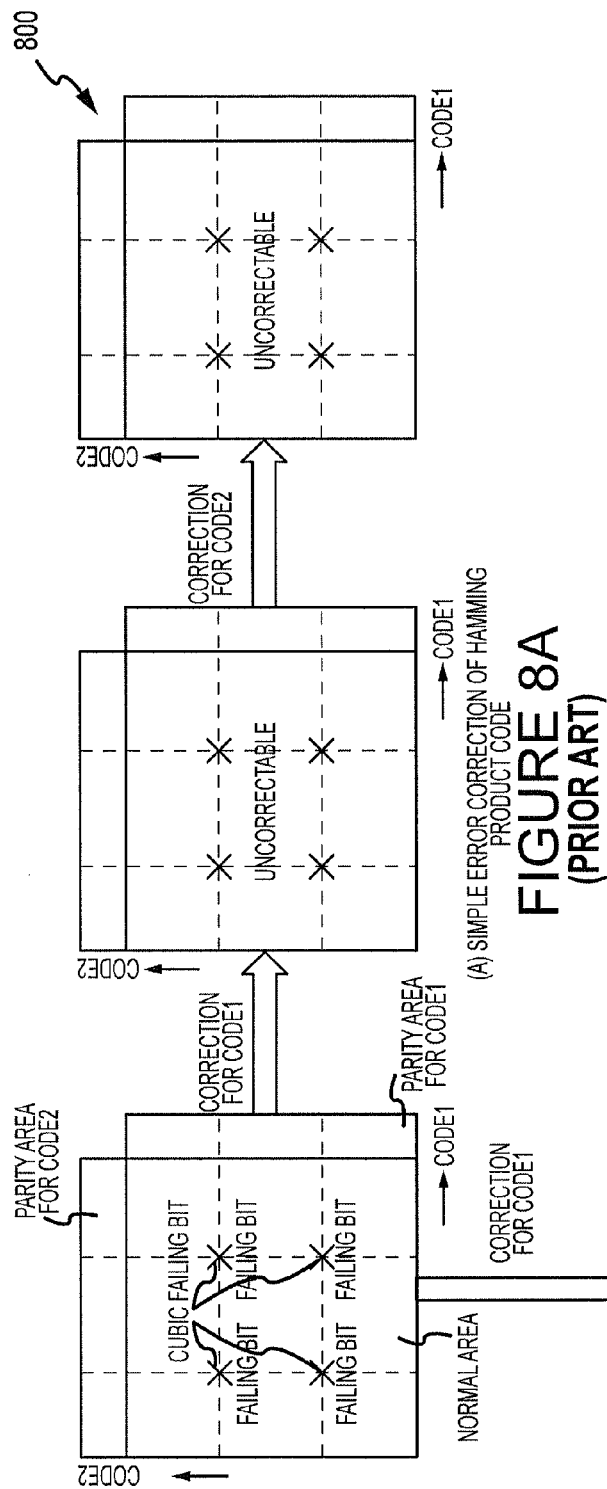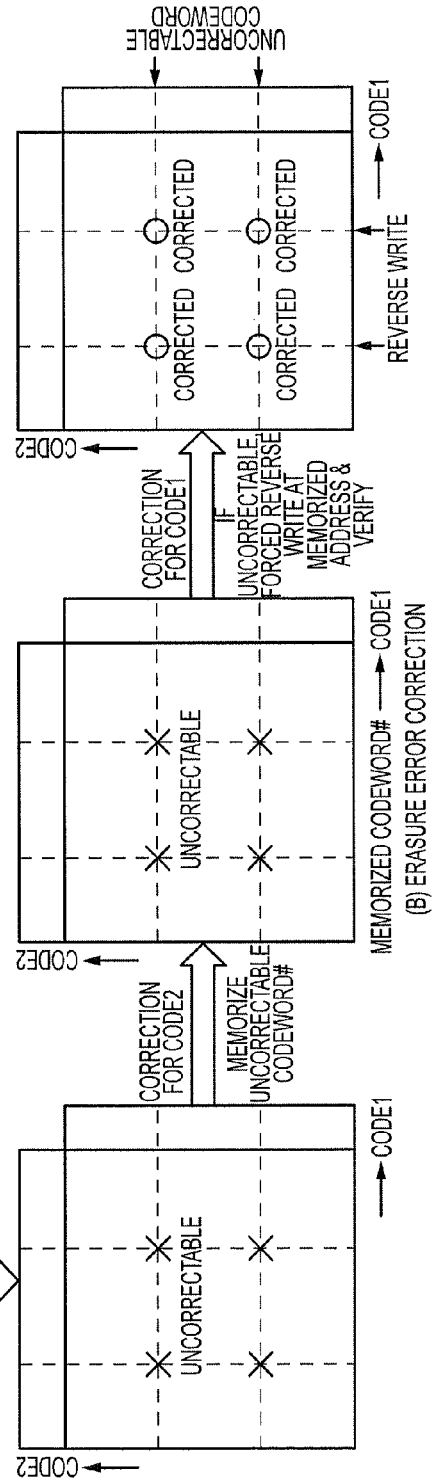
FIGURE 8A (PRIOR ART)
(A) SIMPLE ERROR CORRECTION OF HAMMING PRODUCT CODE
FIGURE 8B
(B) ERASURE ERROR CORRECTION

US 8,307,260 B2

MEMORY APPARATUS AND METHOD USING ERASURE ERROR CORRECTION TO REDUCE POWER CONSUMPTION

CROSS REFERENCE TO RELATED APPLICATION(S)

This application is a continuation of U.S. patent application Ser. No. 12/014,598, filed Jan. 15, 2008, which issued as U.S. Pat. No. 8,117,519 on Feb. 14, 2012. This application and patent are incorporated herein by reference, in their entirety, for any purpose.

TECHNICAL FIELD

Embodiments of this invention relate to dynamic random access memory ("DRAM") devices and, more particularly, to an apparatus and method for checking and correcting data stored in DRAM devices with an erasure correction technique to allow the DRAM devices to consume relatively little power during refresh.

BACKGROUND OF THE INVENTION

Portable electronic devices, such as notebook computers, personal digital assistants ("PDA"), mobile phones, personal entertainment devices and the like, are becoming more and more popular in recent years. Given its portable nature, a portable electronic device is typically powered by battery when in operation. Battery life is thus a critical factor affecting the usefulness of battery-powered electronic devices. Battery life, in turn, is affected by the rate power is consumed by the various components of the electronic device. Because DRAM is widely used in many portable electronic devices, reducing the power consumed by a DRAM device will generally help reducing the overall power consumption.

In general, the power consumption of a DRAM device increases with both the capacity and the operating speed of the DRAM device. The power consumed by a DRAM device is also affected by its operating mode. A DRAM device, for example, will generally consume a relatively large amount of power when the memory cells of the DRAM device are being refreshed in a refresh mode.

As is well-known in the art, DRAM memory cells, each of which typically comprising a transistor and a capacitor, must be periodically refreshed to retain data stored in the DRAM device. A refresh operation essentially requires reading data bits from the memory cells in each row of a memory cell array and then writing those same data bits back to the same cells in the row. A relatively large amount of power is consumed for a DRAM refresh operation because rows of memory cells in a memory cell array of the DRAM are being actuated in rapid sequence. Each time a row of memory cells is actuated a pair of digit lines for each memory cell are switched to complementary voltages and then equilibrated. As a result, refresh operations of a DRAM device tend to be particularly power-hungry operations. Moreover, because memory cell refreshing must be accomplished even when the DRAM device is not being used (e.g., when the DRAM device is inactive), the amount of power consumed by refresh operation is a critical determinant of the amount of power consumed by the DRAM device over an extended period of time. Thus, many attempts to reduce power consumption in DRAM devices have focused on reducing the rate at which power is consumed during refresh.

The power consumed by a refresh operation can, of course, be reduced by lowering the rate at which the memory cells in a DRAM are being refreshed. However, lowering the refresh rate increases the risk that data stored in the DRAM memory cells will be lost. More specifically, because DRAM memory cells are essentially charge-storing capacitors, electric charge inherently leaks from a memory cell capacitor, which can change the value of a data bit stored in the memory cell over time. Moreover, electrical current typically leaks from the memory cell capacitors at varying rates. Some capacitors are essentially short-circuited and are thus incapable of storing charge indicative of a data bit. These defective memory cells can be detected during production testing, and can be repaired by substituting non-defective memory cells using conventional redundancy circuitry. On the other hand, in general current leaks from most DRAM memory cells at much slower rates that span a wide range. Accordingly, a refresh rate is chosen to ensure that all but a few memory cells can store data bits without the data bits being in error.

One technique that has been adopted to prevent error in the stored data bits is to generate an error correcting code, which is known as a parity code or "syndrome," from each set of the stored data bits, and then store the syndrome along with the data. When the data bits are read from the memory cells, the corresponding syndrome is also read and used to determine if any bits of the data are in error. As long as not too many data bits are in error, the syndrome may also be used to correct the read data.

In another technique, a sleep mode using error correction circuitry is employed for low-power data retention. The use of error correction circuitry allows the extension of internal refresh period beyond typical refresh characteristics and thereby achieves reduction of power consumption.

When product codes, such as Hamming product codes, are employed as the error correction algorithm, under certain circumstances some errors in data bits cannot be corrected. For example, when four memory cells having erroneous data bits happen to be the cross points of two rows and two columns of memory cells (referred to as "cubic failing bits" hereinafter), error correction is not impossible but usually requires a much more complex error correction circuitry. Although such cubic failing bits can be corrected by erasure error correction using soft decision decoding, a large circuit is required due to the complex calculation involved. Such approach is thus not suitable for implementation in electronic devices using DRAM.

Accordingly, there is a need and desire for a simple correction algorithm as a viable method for erasure error correction that can be implemented in DRAM devices to achieve relatively low power consumption.

BRIEF DESCRIPTION OF THE DRAWINGS

FIG. 8A is a diagram showing a scenario of simple error correction using Hamming product codes.

FIG. 8B is a diagram showing a scenario of erasure error correction in accordance with an embodiment of the invention.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
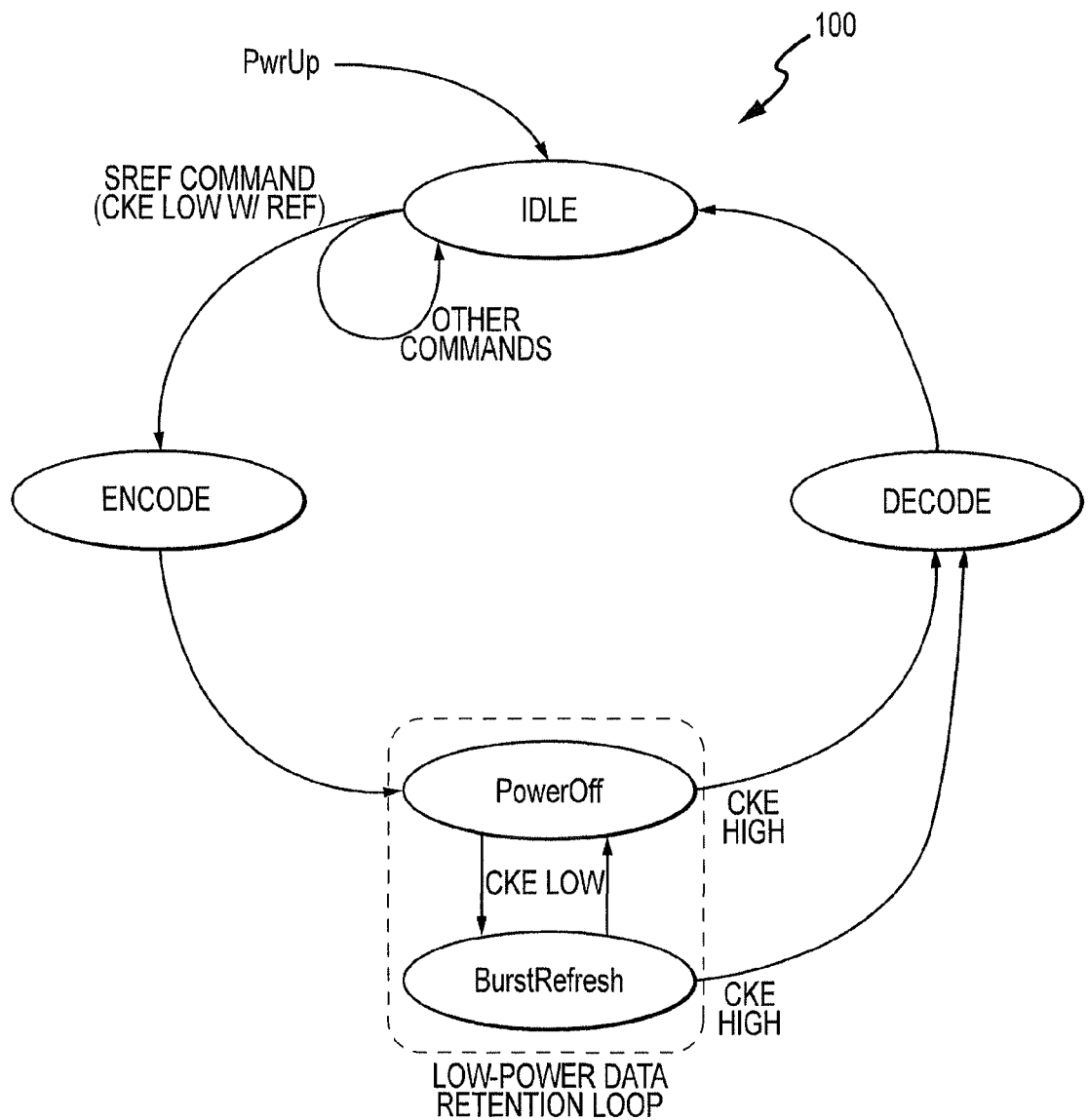
FIG. 1 is a typical state diagram of low-power data retention mode with error correction.

FIG. 1 illustrates a typical state diagram 100 of typical low-power data retention mode with error correction. Low-power data retention mode, or sleep mode, with error correction is a special self-refresh operable which a DRAM enters by a low CKE signal with a REF command or exits by a high CKE signal, for example. In general, the sleep mode operation involves several steps. When a self-refresh SREF command (the combination of a low CKE signal and a REF command) is received, an error correcting circuitry reads data strings from the array of memory cells, generates a parity code for each data string, and writes the parity codes to a designated region of the memory. This step is shown as the "Encode" state in the state diagram 100. Afterwards, the DRAM enters into the low-power data retention cycle, which consists of a loop of "PowerOff"—"BurstRefresh" operations, until the CKE signal switches to high. While in the "PowerOff"—"BurstRefresh" loop, the DRAM power supplies are turned off most of the time as much as possible (>>tREF, the time for memory cell refresh), and are turned on for only a relatively short interval to refresh the memory cells, where the data and the parity codes are stored (burst refresh). When the CKE signal goes high, the error correcting circuitry reads both the data strings and the corresponding parity codes to detect errors in the data strings. If error exists, the error correcting circuitry writes correct data into the part of the array where the data in error was read from. This is shown as the "Decode" state in the state diagram 100. Once the decode state is complete, the DRAM enters into the "Idle" state and accepts commands for normal mode of operation. The DRAM will enter into the Encode state again only upon receiving a low CKE signal and a REF command. Otherwise, the DRAM remains in the Idle state.

Figure 2:
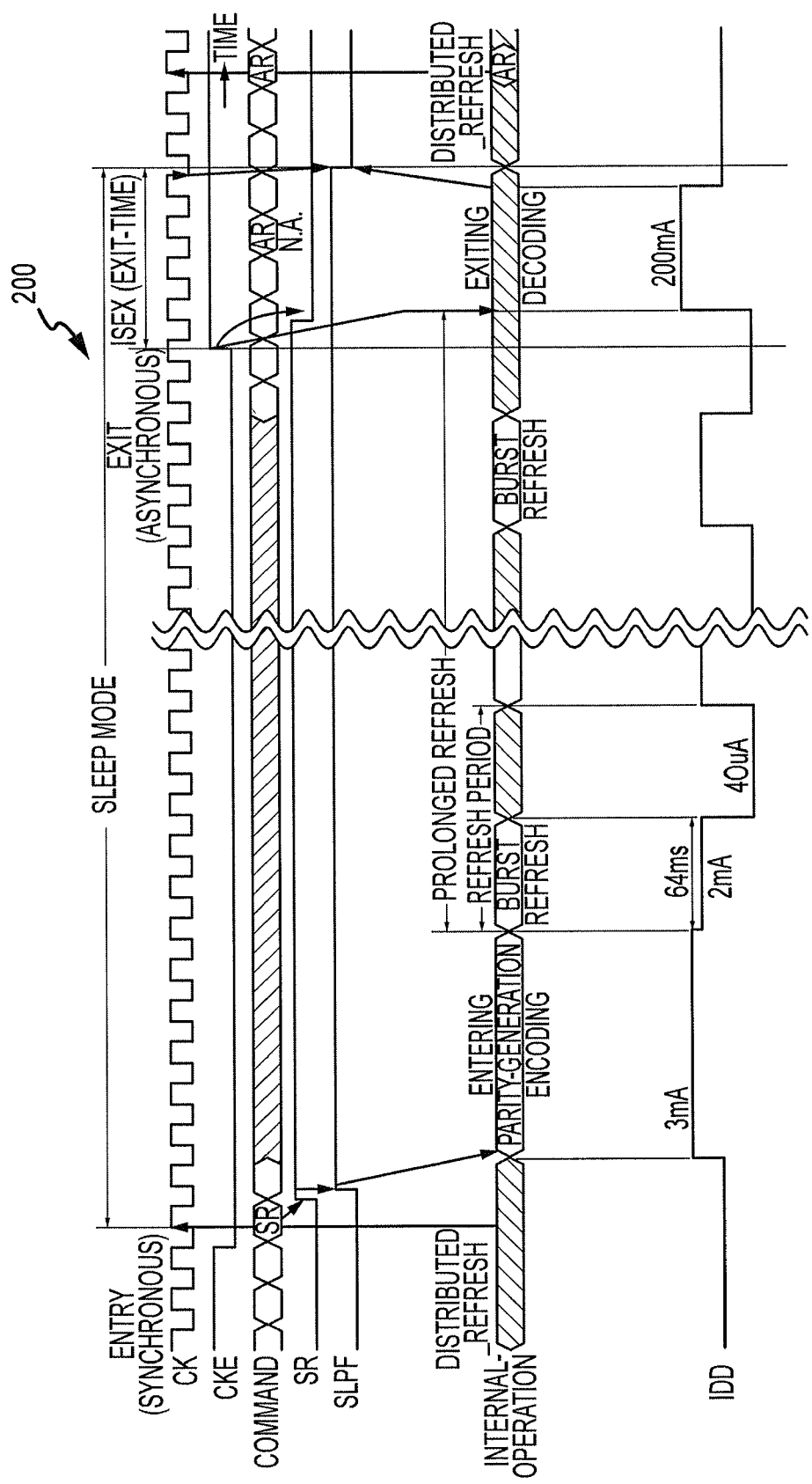
FIG. 2 is a typical timing diagram of low-power data retention mode with error correction.

FIG. 2 illustrates a typical timing diagram 200 of low-power data retention mode in reference to the state diagram 100 in FIG. 1. As shown in FIG. 2, with the CKE signal low, the DRAM enters into the self-refresh (SR) mode upon the receipt of the REF command, as indicated by the SR signal switching high after receiving the REF command. The DRAM then enters into the low-power data retention mode, or sleep mode, if the DRAM has error correcting circuitry for error correction to reduce power consumption by prolonging the power-off period. As discussed previously in reference to FIG. 1, once the DRAM enters into the sleep mode, parity codes are generated in the encode state, followed by the burst refresh—power off loop, which continues until the DRAM exits the sleep mode upon the CKE signal switching to high. When the CKE signal switches high, the DRAM exits the sleep mode and enters into the decode state, as indicated by the SR signal switching low as a result of the CKE signal being high. As previously discussed, during the decode state the error checking and correction operations are performed. Upon completion of error checking and correction, the DRAM returns to the idle state for normal operations.

Figure 3:
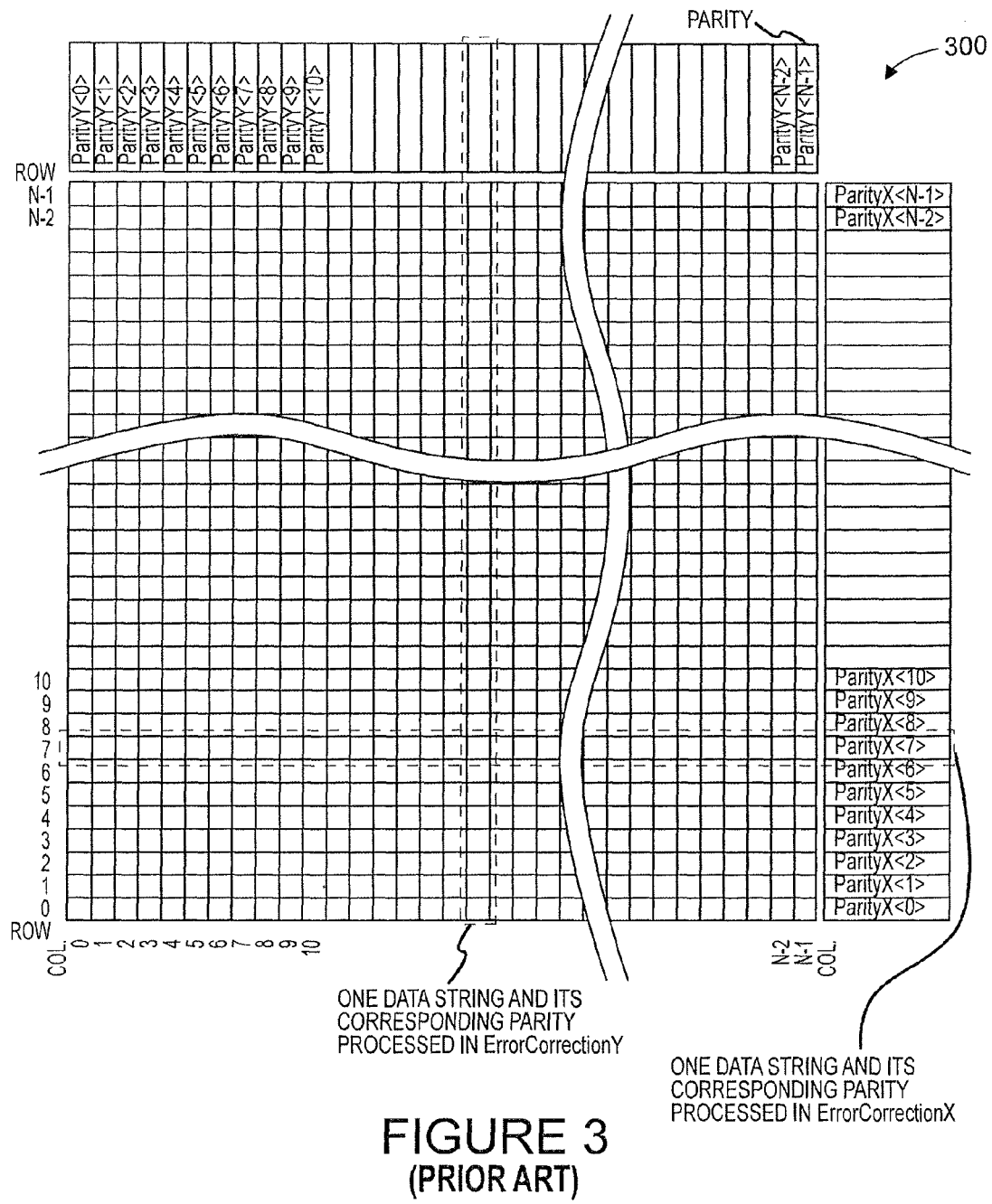
FIG. 3 is a diagram showing a prior art memory array configured for storage of data and parity codes.

FIG. 3 illustrates a memory array 300 configured for storage of data and parity codes. In general, error-correcting such as Hamming code, Reed-Solomon code, and BCH code are suitable for erasure error correction. Each of these error-correcting codes may be employed as the error correction algorithm for embodiments of the erasure error correction methods described later. Typically, a parity code is generated for error detection and correction purposes for each string of data bits in a first direction (e.g., row-wise) and for each string of data in a second direction (e.g., column-wise). The combination of each data string and its corresponding parity code is known as a "codeword" in the art. Although a square-shaped memory array 300 is shown in FIG. 3, it is merely an example and should not be deemed to limit the scope of the invention to only square-shaped memory arrays. Rather, embodiments of the invention may be implemented with, for example, a N×M rectangular-shaped memory array where N and M are not the same.

For the N×N square-shaped memory array 300 shown in FIG. 3, a parity code ParityX<0>-ParityX<N−1>, is generated for each of the N rows and a parity code ParityY<0>-ParityY<N−1> is generated for each of the N columns. As a result, in the example shown in FIG. 3, there are up to N×N, or $N^2$, data bits stored with 2×N, or 2N, parity codes for error detection and correction for the $N^2$ data bits in the memory array 300. Each of the parity codes ParityX<0>-ParityX<N−1> and ParityY<0>-ParityY<N−1>, typically comprising a number of data bits, may be stored physically next to the row or column that it corresponds to as shown in FIG. 3, and also in FIGS. 5, 6, and 9-11. Alternatively, the parity codes may be stored elsewhere such as, for example, another memory different than the one storing the data the parity codes are related to.

Figure 4:
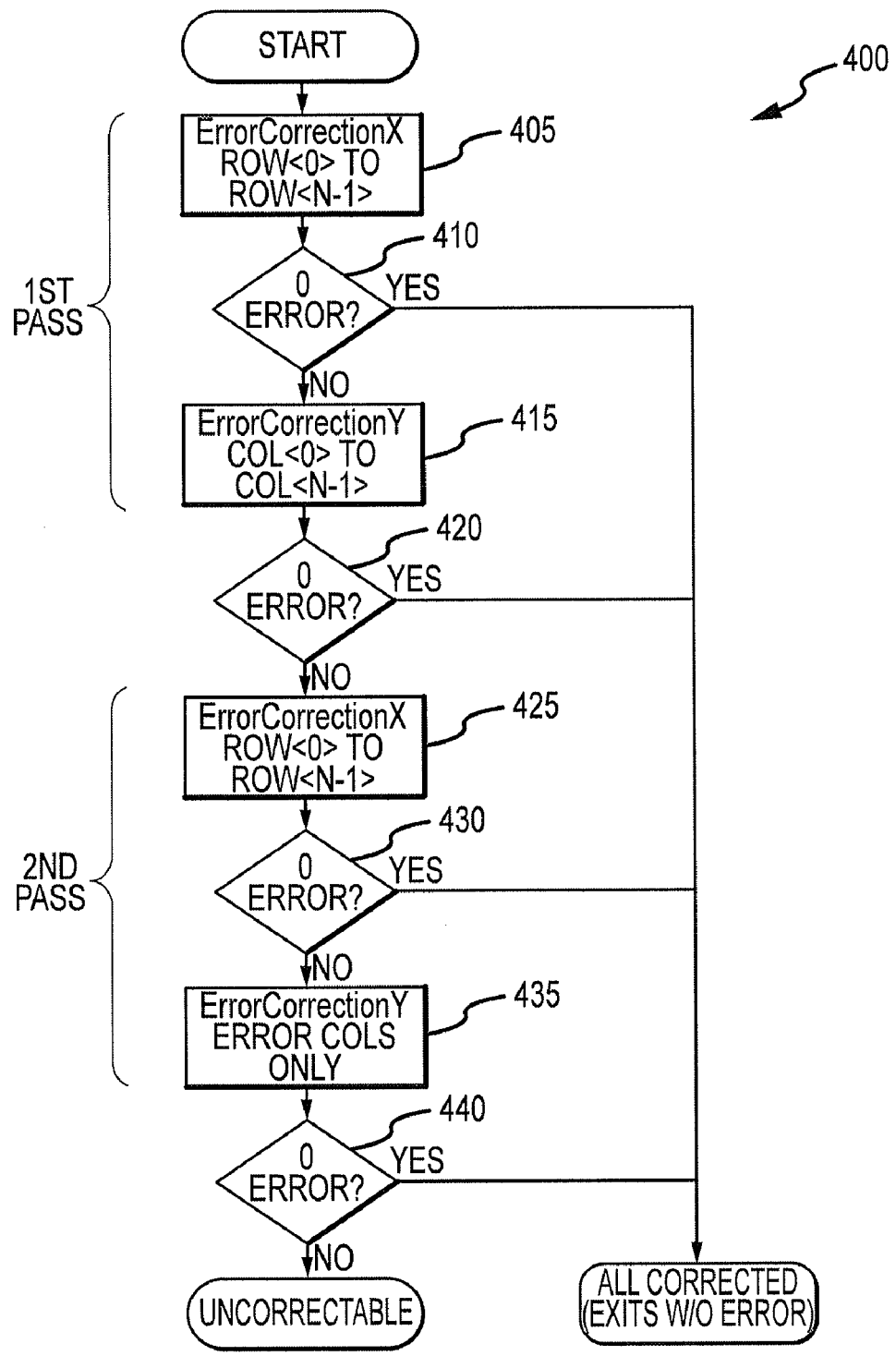
FIG. 4 is a flow chart showing a prior art error correction method in a decode process for error detection and correction.

FIG. 4 illustrates a flow chart 400 of a prior art error correction method in a decode process using error-correcting codes in reference to memory array 300 of FIG. 3. Using an X-Y coordinate system with the row address incrementing in the Y direction and the column address incrementing in the X direction, error correction is first carried out in the X direction for the rows and from row<0> to row <N−1> in step 405. Afterwards, determination is made as to whether or not no error exists in the data bits at this point in step 410. If there is zero error in the data bits stored in the memory array, the decode process ends. However, if error exists in the data bits, the process proceeds to step 415 where error correction is carried out in the Y direction for the columns and from column<0> to column <N−1>. In step 420, determination is made as to whether or not zero error exists in the data bits at this point. If there is zero error in the data bits stored in the memory array, the decode process ends. However, if there is still error in the data bits, the process proceeds to step 425 where error correction is first carried out in the X direction for the rows and from row<0> to row <N−1> for the second time. Then, determination is made as to whether or not error still exists in the data bits in step 430. If error still exists, the process proceeds to step 435 for error correction in the Y direction, for the second time, for the columns and from column<0> to column <N−1>. In step 440, determination is made as to whether there is uncorrectable error (i.e. error still exists in the data bits) or there is no more error (i.e. all error has been corrected). Thus, under the decode process shown in flow chart 400, error correction in the X and Y directions is carried out up to two passes. If error still persists after two passes, the control flow exists the decode process with uncorrectable error in the data bits. Otherwise, the control flow exists the decode process without error in the data bits.

Figures 5A, 5B:
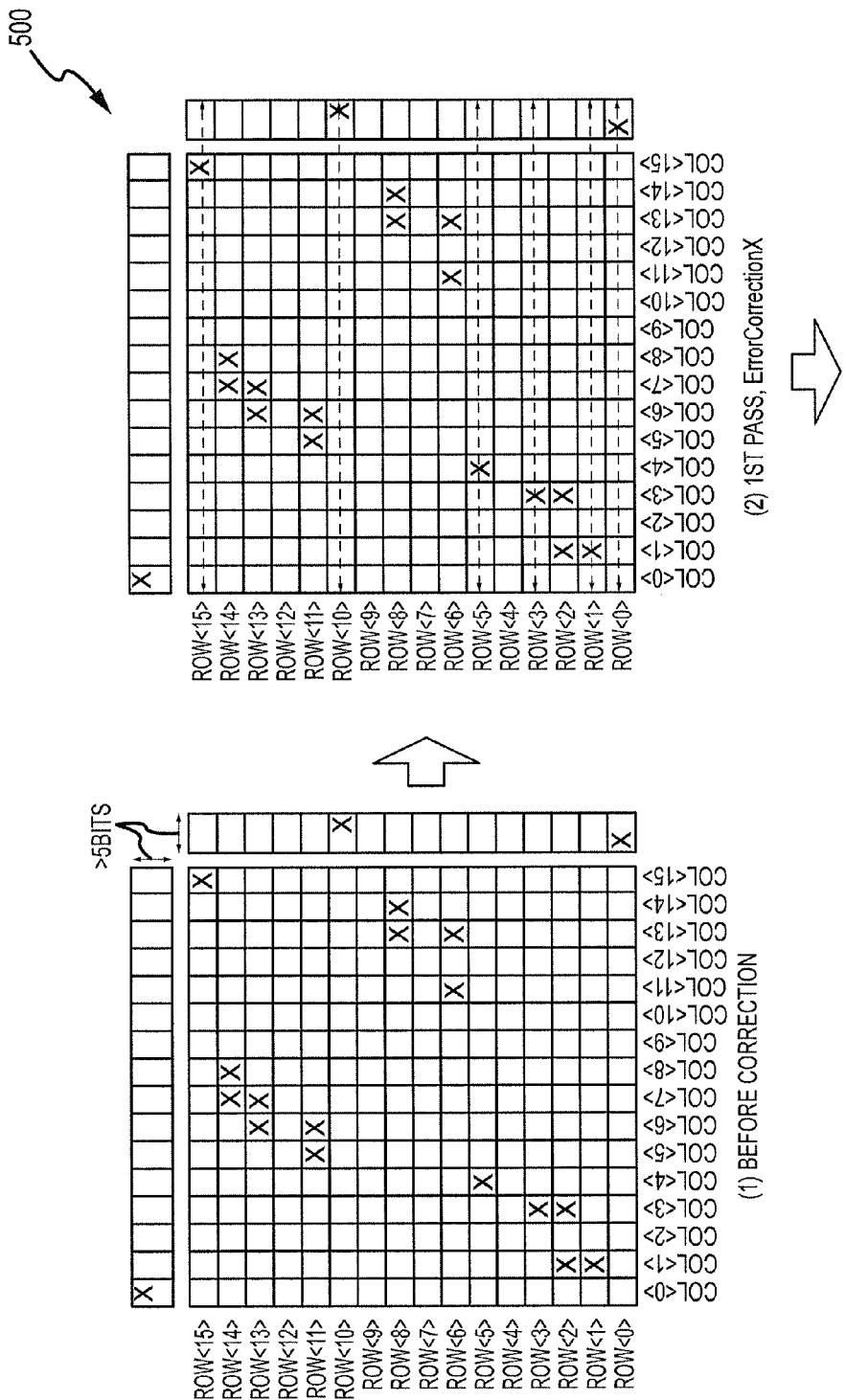
FIG. 5 is a diagram an example of how errors are corrected by each pass of error correction in the X and Y directions using the error correction method of FIG. 4.
Figure 5B:
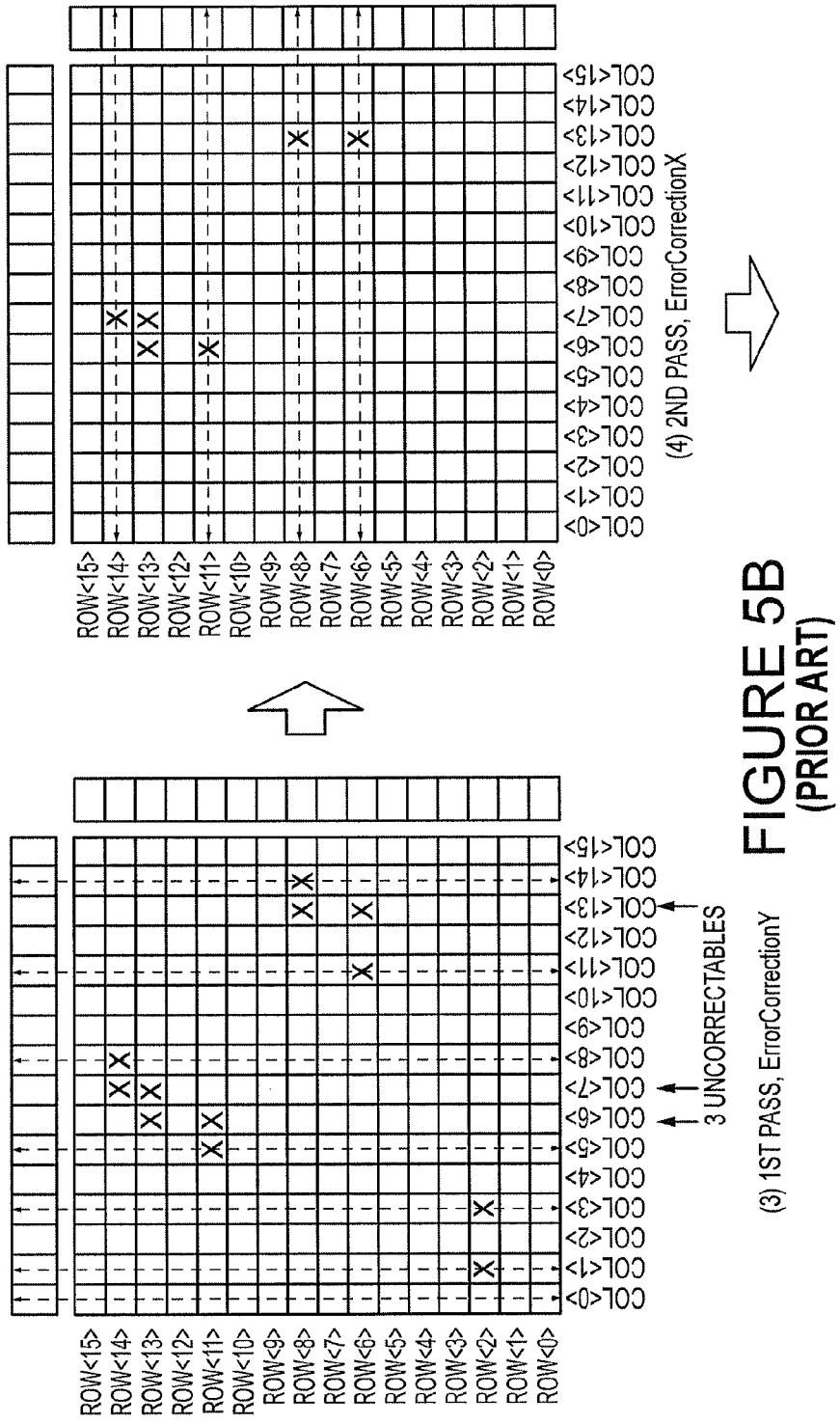
Figure 5C:
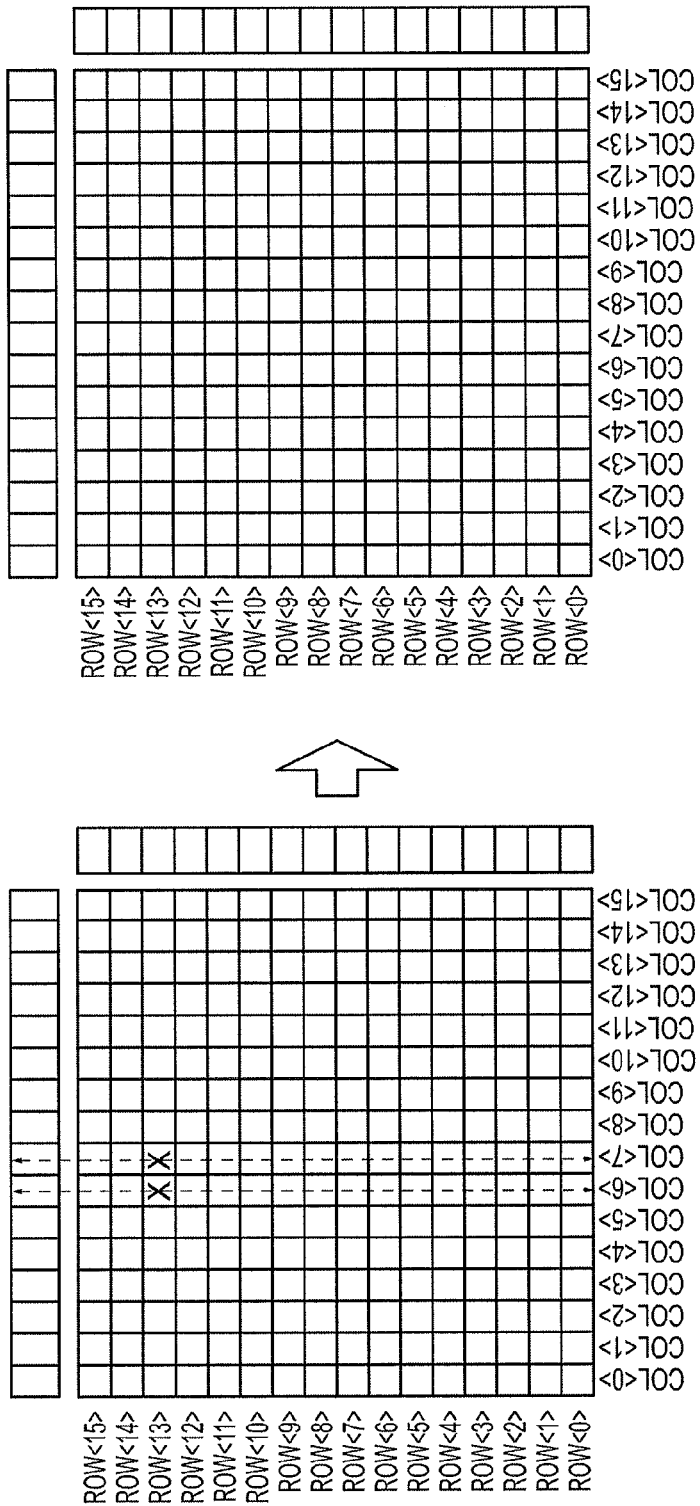

FIG. 5 illustrates a diagram 500 showing an example of how errors are corrected by each pass of error correction in the X and Y directions using the error correction method shown in flow chart 400. It is assumed that the error detection/correction hardware and parity codes have the capability of single-bit correction per data string (e.g. per row or per column of data bits). In this example, a 16×16 square memory array is used for simplicity as the principle is the same for memory arrays of any larger size or other shape (e.g. rectangular). As shown in FIG. 5, stage (1) is the original state of the memory array prior to any error correction with multiple data bits in error, each represented by an "X" in the corresponding memory cell whereas each data bit not in error is represented by a blank memory cell. In stage (2), some of the errors are corrected by the first pass of error correction in the X direction. Specifically, single-bit errors in row<0>, row<1>, row<3>, row<5>, row<10>, and row<15> are corrected by the first pass of error correction in the X direction. In stage (3), some more single-bit errors are corrected by the first pass of error correction in the Y direction, including those in column<0>, column<1>, column<3>, column<5>, column<8>, column<11>, and column<14>. Next, in stage (4), errors in the data bits are further corrected with the second pass of error correction in the X direction. Specifically, errors in row<6>, row<8>, row<11>, and row<14> are corrected in this stage. Lastly, the remaining errors are corrected in stage (5) by the second pass of error correction in the Y direction, which yields an error-free memory array shown in stage (6).

It should be noted that, even though diagram 500 shows an example where all errors in the data bits stored in the memory array are corrected using the error correction method shown in FIG. 4, there are cases where not all errors can be corrected by such error correction method. One example is a case where a four-bit error pattern is present in a 2×2 square area, such as, say, four bits of error with <row, column> addresses of <6, 11>, <6, 13>, <8, 11>, and <8, 13>. With such a four-bit error pattern and assuming single-bit error correction capability, the error correction method shown in FIG. 4 cannot correct the four bits of error. This is because each of row<6>, row<8>, column<11>, and column<13> will have at least two errors remaining at the <row, column>addresses of <6, 11>, <6, 13>, <8, 11>, and <8, 13> no matter how many passes of error correction in the X and Y directions are carried out. More specifically, given that there are at least two bits of error in row<6>, row<8>, column<11>, and column<13>, the single-bit error correction capability of the error detection/correction hardware and parity codes precludes the correction of such four-bit patterned errors. Therefore, with such error pattern the error correction method of flow chart 400 will result in uncorrectable errors in the data bits in the end of the decode process.

Figure 6:
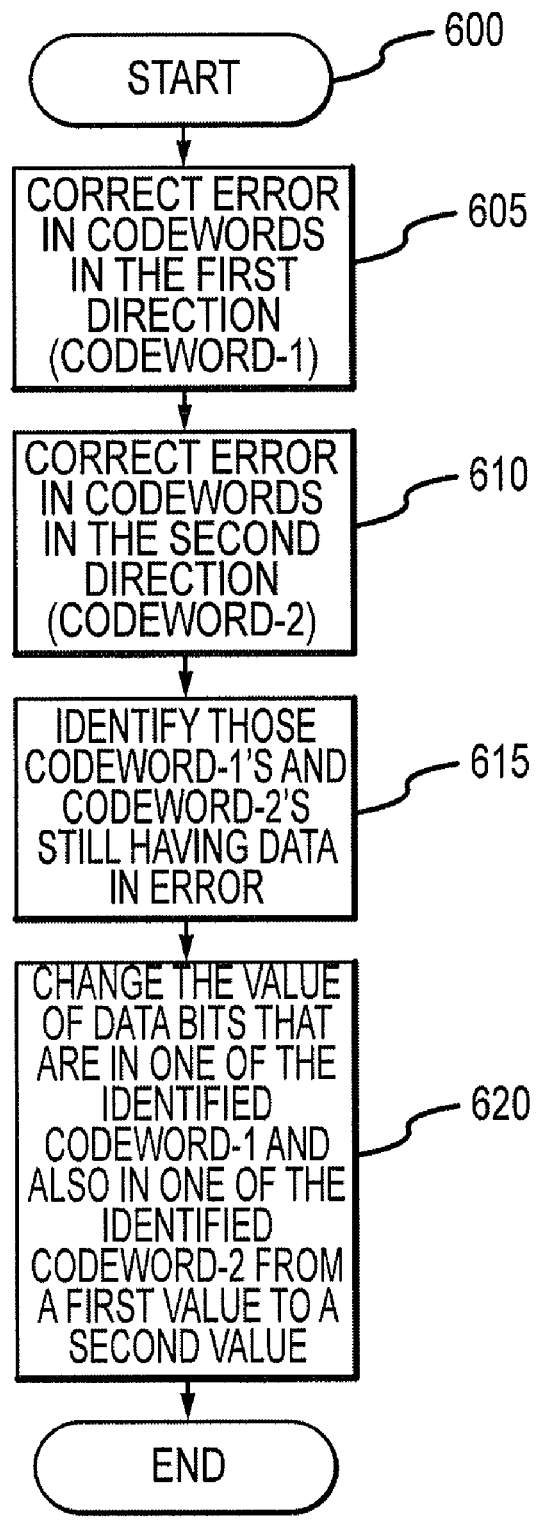
FIG. 6 is a flow chart showing an erasure error correction method of a decode process in accordance with an embodiment of the invention.

FIG. 6 illustrates a flow chart 600 showing an erasure error correction method in a decode process in accordance with an embodiment of the invention. The erasure error correction method of flow chart 600 can be utilized for error correction in a memory array such as the memory array 300 of FIG. 3 where the array of memory cells (and the data bits stored therein) can be viewed as a number of data strings in at least a first direction and a second direction. For example, in a X-Y coordinate system, the X direction may be considered as the first direction and the Y direction may be considered as the second direction, or vice versa. In step 605, codewords in the first direction are read and attempt to correct errors in the codewords in the first direction is carried out. Next, codewords in the second direction are read and attempt to correct errors in the codewords in the second direction is carried out in step 610. Those codewords in the first direction still containing error and those codewords in the second direction still containing error are identified in step 615. With codewords in both directions that still contain error identified, in step 620 the data bit in each memory cell located at the cross point of one of the identified codewords in the first direction and one of the identified codewords in the second direction is flipped to correct the error.

What happens when a data bit is flipped is that the value of the data bit is changed from its existing value to another possible value. In a binary system, this means changing from 0 to 1 or from 1 to 0. In one embodiment, if the memory cell located at one of the cross points stored a voltage level indicative of a binary value of 1, the voltage level is changed (e.g., decreased sufficiently) to indicate a binary value of 0 as a result of the data bit flipping. Likewise, if the memory cell located at one of the cross points stored a voltage level indicative of a binary value of 0, the voltage level is changed (e.g., increased sufficiently) to indicate a binary value of 1 as a result of the data bit flipping.

Figure 7:
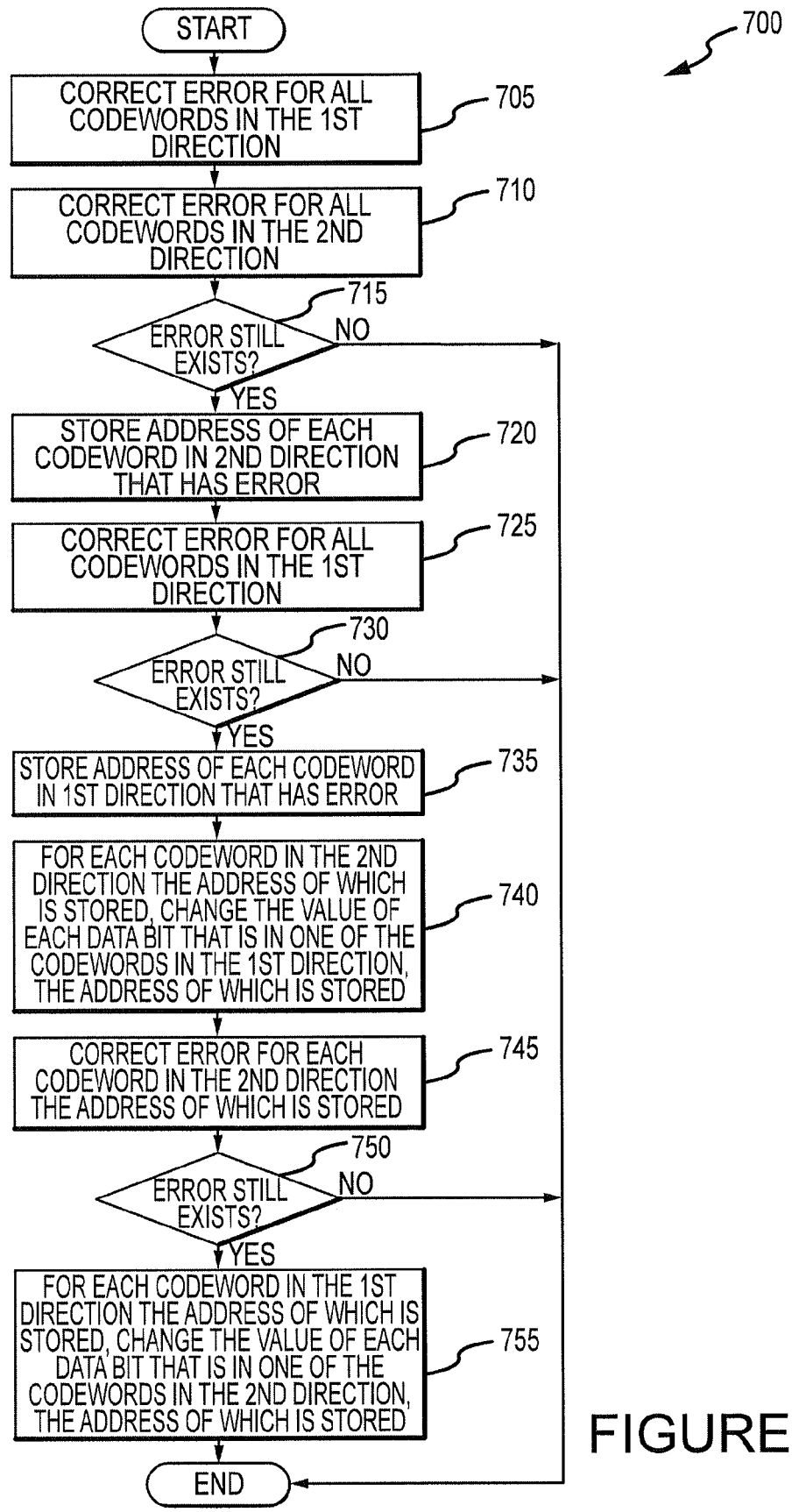
FIG. 7 is a flow chart showing an erasure error correction method of a decode process in accordance with another embodiment of the invention.

FIG. 7 illustrates a flow chart 700 showing an erasure error correction method of a decode process in accordance with another embodiment of the invention. Like the method of flow chart 600, the erasure error correction method of flow chart 700 can be utilized to correct errors in a memory array such as the memory array 300 of FIG. 3 where the array of memory cells (and the data bits stored therein) can be viewed as a number of data strings in at least a first direction and a second direction. In step 705, attempt to correct error in codewords in the first direction is carried out. Similarly, attempt to correct error in codewords in the second direction is carried out in step 710. In step 715, a determination as to whether error still exists in the codewords in both directions is made. If it is determined that no more error exists in the codewords in both directions, the error correction process ends as there is no more error left to be corrected. If, however, it is determined that error still exists in the codewords, the process proceeds to step 720 where the address of each code word in the second direction still containing error is stored. In step 725, attempt to correct error in codewords in the first direction is carried out again. Afterwards, a determination as to whether error still exists in the codewords in both directions is made in step 730. If it is determined that no more error exists in the codewords in both directions, the error correction process ends. If it is determined that error still exists in the codewords, the process proceeds to step 735 where the address of each code word in the first direction still containing error is stored. In step 740, for each codeword in the second direction the address of which is stored in step 720, the data bit stored in any of its memory cell that is also in one of the codewords in the first direction the addresses of which are stored is flipped. In one embodiment, in a binary system, a stored binary value of 0 is changed to the binary value of 1, and a stored binary value of 1 is changed to the binary value of 0 as a result of the data bit flipping. In step 745, attempt to correct error in those codewords in the second direction the addresses of which are stored is carried out. Again, a determination as to whether error still exists in the codewords in both directions is made in step 750. If it is determined that no more error exists in the codewords in both directions, the error correction process ends. If it is determined that error still exists in the codewords, then, in step 755, for each codeword in the first direction the address of which is stored in step 735, the data bit stored in any of its memory cell that is also in one of the codewords in the second direction the addresses of which is stored is flipped. As mentioned previously, in one embodiment in a binary system, a stored binary value of 0 is changed to the binary value of 1, and a stored binary value of 1 is changed to the binary value of 0 as a result of the data bit flipping.

FIG. 8A illustrates a diagram 800(*a*) showing a scenario of simple error correction using Hamming product codes. As known in the art, Hamming codes can detect and correct single-bit errors in a single data string. Additionally, Hamming codes typically can detect, but not correct, two or more simultaneous bit errors in a single data string. In the given scenario in diagram 800(*a*), a cubic failing bit pattern (the data bits in error are shown as "X") exists in the memory cell array. More specifically, there are four memory cells, each storing a data bit in error, located at the four cross points of two codewords in a first direction (e.g., "Code1" in FIG. 8A) and two codewords in a second direction (e.g., "Code2" in FIG. 8A). Here, attempt to correct errors in the Code1 direction is first carried out. Although Hamming codes can detect the existence of two errors in each of the two codewords in the Code1 direction, the algorithm nevertheless cannot correct the two errors due to its failure to pinpoint the location of the two errors. Attempt to correct errors in the Code2 direction is then carried out. Again, although the existence of the two errors in each of the two codewords in the Code2 direction can be detected, the errors are not corrected. This leaves uncorrectable errors in the cubic failing bit pattern in the memory cell array.

FIG. 8B illustrates a diagram 800(*b*) showing a scenario of erasure error correction in accordance with an embodiment of the invention. An erasure error correction method such as one of the flow charts of FIG. 6 and FIG. 7, or a similar variation, may be in use. As in the case of the scenario in diagram 800(*a*), the initial attempt to correct errors in the Code1 direction results in uncorrectable error due to the failure of Hamming codes to correct the two-bit errors in the two codewords with error in the Code1 direction. However, when attempt to correct errors in the Code2 direction results in uncorrectable error again, the addresses of those codewords in the Code2 direction with uncorrectable error are memorized. Then, attempt to correct errors in the Code1 direction is repeated again. This time, for each of those codewords in the Code1 direction with detectable but uncorrectable errors, the algorithm flips the data bit of any memory cell of these codewords that is also in one of the codewords in the Code2 direction the addresses of which were memorized in the previous step. As shown in diagram 800(*b*), because the four data bits in error in the two codewords in the Code1 direction that have detectable but uncorrectable errors are also in the two codewords in the Code2 direction the addresses of which were memorized previously, the act of flipping the data bits effectively corrects the uncorrectable errors in the cubit failing bit pattern. In FIG. 8B the corrected data bits are shown as "O".

Figure 9:
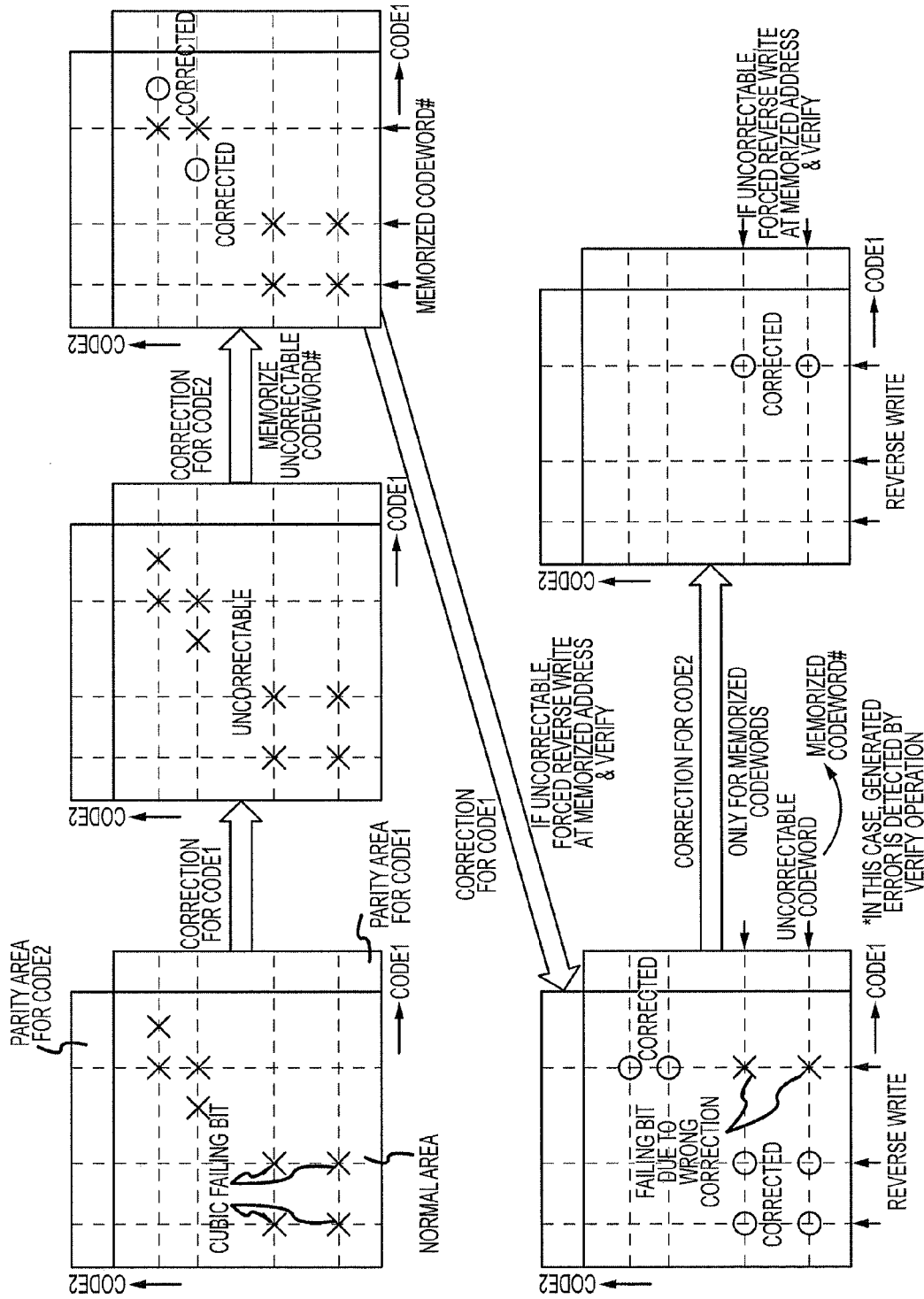
FIG. 9 is a diagram showing another scenario of erasure error correction in accordance with an embodiment of the invention.

FIG. 9 illustrates a diagram 900 showing another scenario of erasure error correction in accordance with an embodiment of the invention. Here, in addition to a cubit failing-bit pattern, there are a few more data bits in error. Using an erasure error correction method similar to that shown in FIG. 6 or FIG. 7, error correction in the Code1 direction is first carried out. In this scenario, because the four Code1 codewords with error all have more than one data bit in error none of the errors are corrected in this pass of error correction. When error correction in the Code2 direction is carried out, two of the erroneous data bits are corrected due to the fact that each of these two bits is a single-bit error in its respective Code2 codeword. Additionally, those Code2 codewords with uncorrectable errors are identified (e.g., the addresses of which are memorized). Error correction in the Code1 direction is again repeated, and, if uncorrectable error persist, data bit flipping will also be executed. As can be seen, two of the data bits in error remaining from the previous pass are corrected due to the fact that each of these two bits is a single-bit error in its respective Code1 codeword. Moreover, the four data bits of the cubic failing-bit pattern are corrected as a result of the data bit flipping given that these four bits are in the two Code2 codewords that were identified (e.g., the addresses of which were memorized) previously. However, a side effect of data bit flipping is that, as can be seen, two of the previously error-free data bits are now in error as a result of the data bit flipping. This happens because these two data bits not only are in one of the three Code2 codewords with uncorrectable errors in the previous pass but also are each in one of the two Code1 codewords with uncorrectable errors in the current pass. Because of the existence of these two newly created error bits, the algorithm identifies the two Code1 codewords in which these two data bits are located. In the next pass, when error correction in the Code2 direction is repeated, the two remaining erroneous data bits are corrected as a result of data bit flipping.

It should be noted that in the scenarios just described in FIGS. 8B and 9, whether using the erasure error correction method of FIG. 6 or FIG. 7, when error correction is carried out for the second time in either the Code1 or Code2 direction it is not necessary to conduct error correction for all of the codewords in that direction. In particular, in one embodiment, error correction may be carried out for just those codewords that were identified with uncorrectable errors in the previous pass for the same direction. This would save both the time and power consumed in error correction. In another embodiment, error correction may be carried out for all the codewords regardless that only some of them still have errors.

Figure 10:
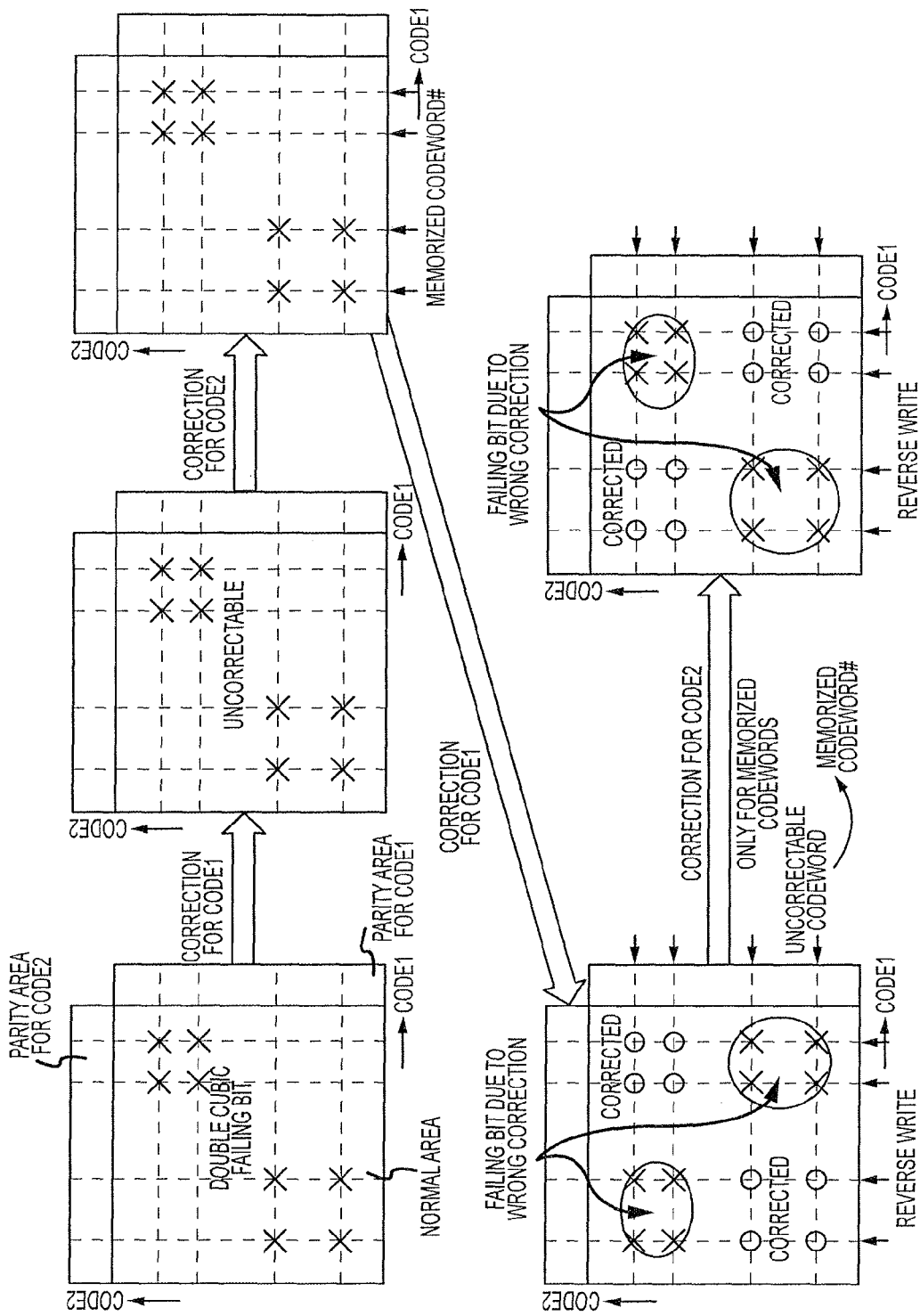
FIG. 10 is a diagram showing yet another scenario of erasure error correction in accordance with an embodiment of the invention.

FIG. 10 illustrates a diagram 1000 showing yet another scenario of erasure error correction in accordance with an embodiment of the invention. In this scenario, there are not only one but two cubic failing-bit patterns of erroneous data bits existing in the memory cell array. Although it is rare for such an occasion to occur, this scenario is given to illustrate a situation where uncorrectable errors persist even when embodiments of the erasure error correction methods are employed to correct the errors. Given that the process of error correction carried out in FIG. 10 is similar to those in FIGS. 8B and 10, in the interest of brevity only the highlight of this scenario will be discussed.

In FIG. 10, due to the physical locations of the two cubic failing-bit patterns, there are sixteen cross points arising from the intersection of four Code1 codewords with uncorrectable errors and four Code2 codewords with uncorrectable errors. As such, when data bit flipping is executed all sixteen data bits located at the cross points are changed from one respective value to another. Although the data bit flipping corrects the errors in eight of the sixteen data bits that were originally erroneous, it also creates eight new data bits in error. When error correction is carried out for the other direction, data bit flipping takes place again. As a result, the data bits located at the sixteen cross points are inverted back to their original values. In other words, at this stage it is as if no error correction was ever carried out with respect to the eight original data bits in error. Thus, in a rare case such as the scenario shown in FIG. 10, the errors will remain uncorrectable even with the erasure error correction method in accordance with an embodiment of the invention.

Figure 11:
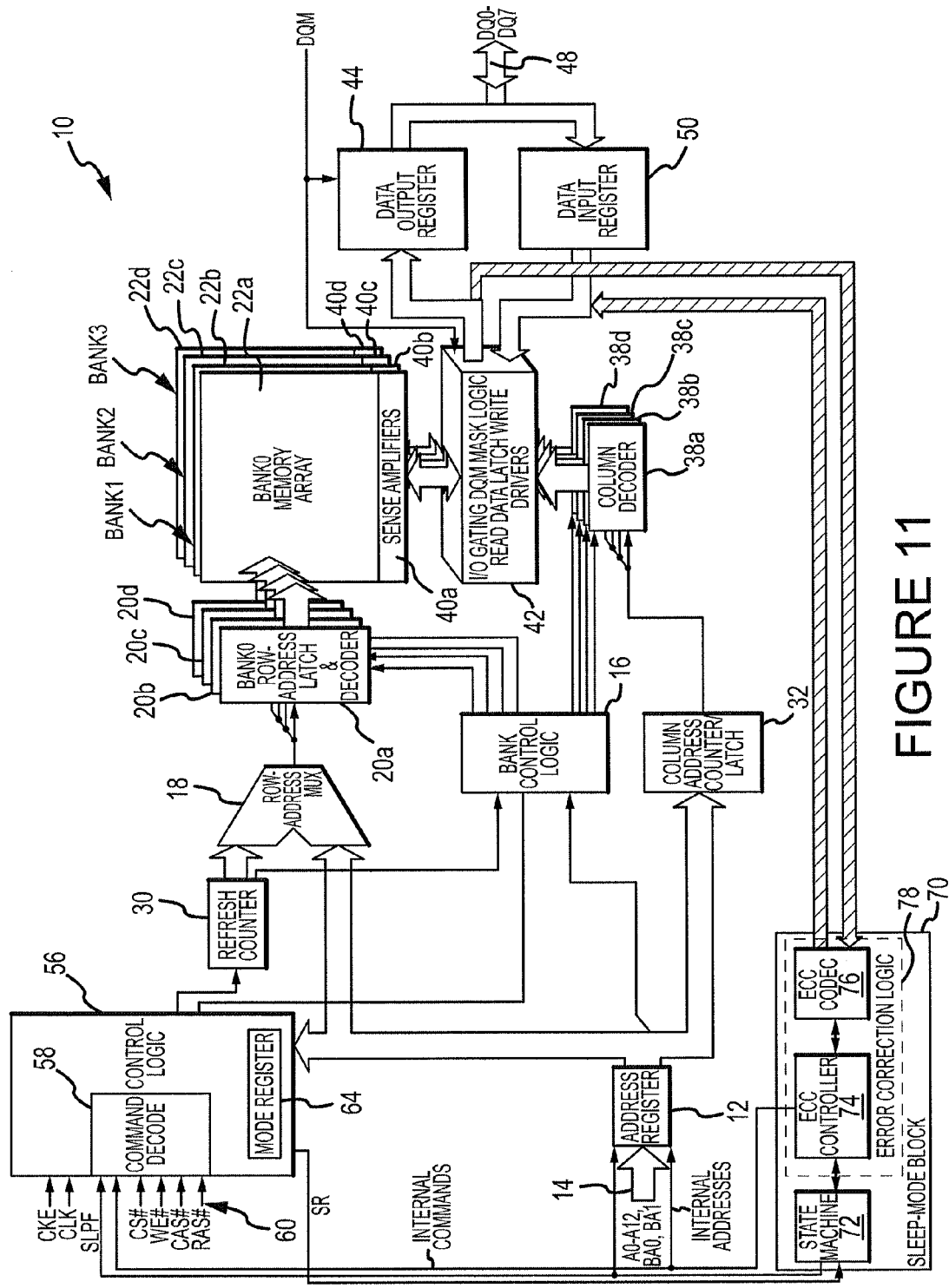
FIG. 11 is a simplified block diagram of a synchronous DRAM ("SDRAM") in accordance with an embodiment of the invention.

FIG. 11 illustrates a simplified block diagram of a SDRAM 10 in accordance with an embodiment of the invention. It should be understood that DRAM devices typically include a large number of other components, which have been omitted from FIG. 11 in the interests of brevity and clarity. The SDRAM 10 includes an address register 12 that receives bank addresses, row addresses and column addresses on an address bus 14. The address bus 14 is generally coupled to a memory controller (not shown in FIG. 1). Typically, a bank address is received by the address register 12 and is coupled to bank control logic 16 that generates bank control signals, which are described further below. The bank address is normally coupled to the SDRAM 10 along with a row address. The row address is received by the address register 12 and applied to a row address multiplexer 18. The row address multiplexer 18 couples the row address to row address latch & decoder circuit 20a-d for each of several banks of memory cell arrays 22a-d, respectively. One of the latch & decoder circuits 20a-d is enabled by one of the control signals from the bank control logic 16 depending on which bank of memory cell arrays 22a-d is selected by the bank address. The selected latch & decoder circuit 20 applies various signals to its respective bank 22 as a function of the row address stored in the latch & decoder circuit 20. These signals include word line voltages that activate respective rows of memory cells in the banks 22. The row address multiplexer 18 also couples row addresses to the row address latch & decoder circuits 20a-d for the purpose of refreshing the memory cells in the banks 22a-d. The row addresses are generated for refresh purposes by a refresh counter 30. 10421 After the bank and row addresses have been applied to the address register 12, a column address is applied to the address register 12. The address register 12 couples the column address to a column address counter/latch circuit 32. The counter/latch circuit 32 stores the column address, and, when operating in a burst mode, generates column addresses that increment from the received column address. In either case, either the stored column address or incrementally increasing column addresses are coupled to column address & decoders 38a-d for the respective banks 22a-d. The column address & decoders 38a-d apply various signals to respective sense amplifiers 40a-d through column interface circuitry 42. The column interface circuitry 42 includes conventional I/O gating circuits, DQM mask logic, read data latches for storing read data from the memory cells in the banks 22 and write drivers for coupling write data to the memory cells in the banks 22.

Data to be read from one of the banks 22a-d are sensed by the respective set of sense amplifiers 40a-d and then stored in the read data latches in the column interface circuitry 42. The data are then coupled to a data output register 44, which applies the read data to a data bus 48. Data to be written to the memory cells in one of the banks 22a-d is coupled from the data bus 48 through a data input register 50 to write drivers in the column interface circuitry 42. The write drivers then couple the data to the memory cells in one of the banks 22a-d. A data mask signal "DQM" is applied to the column interface circuitry 42 and the data output register 44 to selectively alter the flow of data into and out of the column interface circuitry 42, such as by selectively masking data to be read from the banks of memory cell arrays 22a-d. The width of the internal input/output bus that transfer data between the column interface circuitry 42, the data output register 44, and the data input register 50 may be, for example, 32 bits, 64 bits, 128 bits, or any other number of bits depending on the application.

The above-described operation of the SDRAM 10 is controlled by control logic 56, which includes a command decoder 58 that receives command signals through a command bus 60. These high level command signals, which are typically generated by a memory controller (not shown in FIG. 1), are a clock a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 56 also receives a clock signal CLK and a clock enable signal CKE#, which cause the SDRAM 10 to operate in a synchronous manner. The control logic 56 generates a sequence of control signals responsive to the command signals to carry out the function (e.g., a read or a write) designated by each of the command signals. The control logic 56 also applies signals to the refresh counter 30 to control the operation of the refresh counter 30 during refresh of the memory cells in the banks 22. The control signals generated by the control logic 56, and the manner in which they accomplish their respective functions, are conventional. Therefore, in the interest of brevity, a further explanation of these control signals will be omitted. The control logic 56 also includes a mode register 64 that may be programmed by signals coupled through the command bus 60 during initialization of the SDRAM 10. The mode register 64 then generates mode control signals that are used by the control logic 56 to control the operation of the SDRAM 10 in various modes.

The SDRAM 10 also includes a sleep-mode block 70 in accordance with an embodiment of the invention. The sleep-mode block 70 includes a state machine 72, an error correcting code ("ECC") controller 74, and an ECC coder/decoder ("codec") 76. In operation, when the SDRAM 10 is to enter into a sleep mode, the control logic 56 issues a signal SR to the state machine 72. Upon receiving the SR signal, the state machine 72 outputs a signal SLPF to the control logic 56 to initiate sleep-mode operation for the SDRAM 10. While in sleep mode, the control logic 56 and the address register 12 receive and respond to internal commands and internal addresses, respectively, issued by the ECC controller 74, and ignore external commands and addresses.

The state machine 72 follows the state diagram 100 of FIG. 1 by a self-refresh

SREF command. As the operation flows through the different states according to the state diagram 100, the state machine 72 enables the ECC controller 74 to perform the required tasks. The ECC controller 74, in turn, generates coder/decoder control signals to control the operation of the ECC codec 76. The ECC codec 76 generates a parity for each data string during the Encode state, and detects/corrects errors during the Decode state, in reference to the state diagram 100. In one embodiment, one ECC codec 76 is employed in the SDRAM 10. In another embodiment, more than one ECC codec 76 is employed in the SDRAM 10 to work in parallel to speed up the process.

It should be understood that FIG. 11 is merely an example of one of the various embodiments of the invention. For instance, instead of having an ECC controller 74 and an ECC codec 76, as shown in FIG. 11, a DRAM device in accordance with another embodiment of the invention may have an error correction logic 78 that is capable of performing the functions of ECC controller 74 and ECC codec 76. In yet another embodiment, there may be additional circuitry (not shown) in the sleep-mode block 70 that perform other functions. It should also be understood that the erasure error correction algorithms or methods in accordance with embodiments of the invention as discussed herein can be implemented irrespective of the physical configuration of the error correcting circuitry, whether the implementation uses the ECC controller 74 and ECC codec 76, the error correction logic 78, or similar error correcting circuitry.

Figure 12:
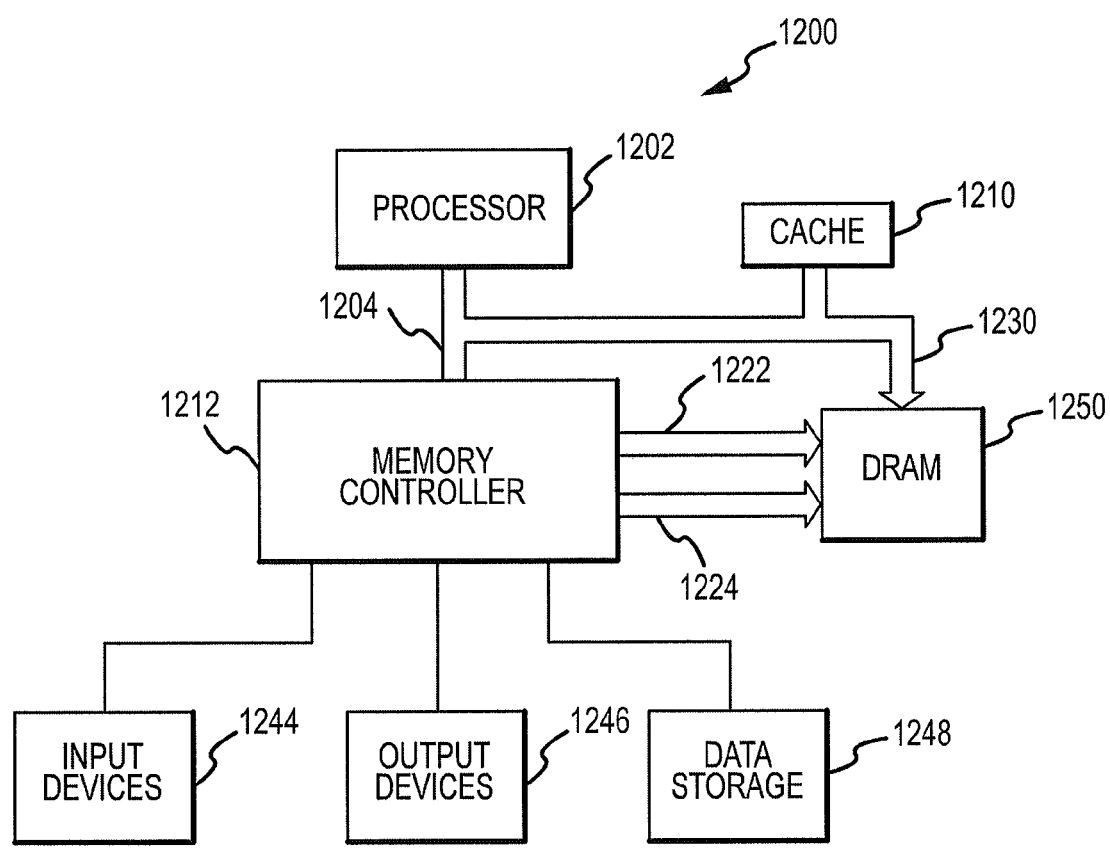
FIG. 12 is a simplified block diagram of an electronic device including a DRAM device according to an embodiment of the invention.

FIG. 12 illustrates a simplified block diagram 1200 of an electronic device including a DRAM device having circuitry for error detection and correction in accordance with an embodiment of the invention, such as the DRAM device of FIG. 11. The electronic device 1200 may be, for example, a notebook computer, a PDA, a mobile phone, or a processor-based system using a DRAM device. The electronic device 1200 includes a processor 1202 for performing various computing functions, such as executing specific software to perform specific calculations or tasks. The processor 1202 includes a processor bus 1204 that normally includes an address bus, a control bus, and a data bus. In addition, the electronic device 1200 includes one or more input devices 1244, such as a keypad, touch-sensitive screen, keyboard, or a mouse, coupled to the processor 1202 to allow an user to interface with the electronic device 1200. Typically, the electronic device 1200 also includes one or more output devices 1246 coupled to the processor 1202, such output devices typically being a video terminal, an audio terminal, or a printer. One or more data storage devices 1248 are also typically coupled to the processor 1202 to allow the processor 1202 to store data or retrieve data from internal or external storage media (not shown). Examples of typical storage devices 1208 include hard drives, compact disk read-only memories (CD-ROMs), and the like. The processor 1202 is also typically coupled to cache memory 1210 and to the DRAM device 1250, which may be a synchronous DRAM, such as the SDRAM 10 of FIG. 11, or another variety of DRAM, through a memory controller 1212. The memory controller 1220 normally includes a control bus 1222 and an address bus 1224 that are coupled to the DRAM device 1250. A data bus 1230 of the DRAM device 1250 may be coupled to the processor bus 1204 either directly (as shown), through memory controller 1220, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An error correction circuit coupled to a plurality of memory cells in a memory device, comprising:
    an error correcting code ("ECC") generator coupled to the memory cells, the ECC generator operable to generate a respective correction code for each data bit string in a first direction and generate a respective correction code for each data bit in a second direction; and
    an ECC controller coupled to the memory cells and the ECC generator, the ECC controller operable to cause a data bit share by an identified data bit string in the first direction and the identified data bit string in the second direction to be changed from a respective existing value to a respective new value different than the respective existing value responsive to the identified bit string having more than one data bit in error, and wherein the ECC controller is further operable to determine whether or not at least one of the data bits is still in error after each of the shared data bits has been changed to the respective new value.

2. The error correction circuit of claim 1, wherein the ECC controller is further operable to determine whether or not at least one of the data bits is still in error responsive to the generated respective correction code for an associated row or an associated column of each data bit still in error.

3. The error correction circuit of claim 1, wherein the ECC controller is further operable to correct the data bit(s) still in error responsive to determining that at least one of the data bits is still in error.

4. The error correction circuit of claim 3, wherein the ECC controller is further operable to correct the data bit(s) responsive to the generated respective correction code for an associated row or an associated column of each data bit still in error.

5. The error correction circuit of claim 1, wherein the ECC controller is operable to cause the data bit to be changed responsive to one of the identified bit strings having two data bits in error.

6. The error correction circuit of claim 1, wherein the ECC controller is operable to cause the data bit to be changed responsive to both of the identified bit strings having two data bits in error.

7. The error correction circuit of claim 1, wherein the ECC controller is operable to cause a plurality of data bits shared by the identified bit strings to be changed from respective existing values to respective new values different than the respective existing values responsive to both of the identified bit strings having two data bits in error.

8. The error correction circuit of claim 1, wherein the ECC controller is further operable to cause a plurality of data bits, other than the data bit shared by the identified bit strings, to change responsive to the plurality of data bits being incorrect.

9. The error correction circuit of claim 1, wherein the correction code for each data bit string in the first direction and each data bit string in the second direction comprises a Hamming code.

10. A method for identifying errors in memory cells, the method comprising:
    verifying an error status of stored data bits for rows of memory cells having data bits in error and also for columns of memory cells having data bits in error;
    storing a respective row address of each row of memory cells having data bits in error and storing a respective column address of each column of memory cells having data bits in error; and
    identifying each of the memory cells having an associated row address that is one of the stored row addresses and also having an associated column address that is one of the stored column addresses.

11. The method of claim 10, further comprising correcting the data bits of each of the identified memory cells having one of the stored row addresses and also having one of the stored column addresses.

12. The method of claim 10, wherein the error status of stored data bits for each of the rows and each of the columns of is verified by comparing a respective stored correction code with a respective computed correction code responsive to the stored data bits in the respective row or column.

13. The method of claim 10, wherein the verifying, storing, and identifying are performed responsive to a request to change an operating mode of the memory cells from a sleep mode to an idle mode.

14. A method, comprising:
   attempting to correct bit errors in a plurality of columns of an array of memory cells;
   attempting to correct bit errors in a plurality of rows of the array of memory cells;
   identifying respective column and row addresses of respective columns and rows of the array of memory cells still including bit errors after the attempted correction of bit errors;
   changing a bit value at each intersection of the identified respective column and row addresses; and
   determining whether one of the plurality of columns or one of the plurality of rows still include bit errors after changing the bit value at each intersection of the identified respective column and row addresses.

15. The method of claim 14, further comprising attempting to correct bit errors in one of the plurality of columns or the plurality of rows responsive to the determining.

16. The method of claim 14, wherein the determining comprises checking each of the identified respective columns and rows for bit errors.

17. The method of claim 14, wherein the determining comprises checking each of the plurality of rows and columns for bit errors.

18. The method of claim 14, further comprising generating a respective error correction code for each of the plurality of columns and each of the plurality of rows for use in the attempting to correct bit errors.

19. The method of claim 18, wherein each respective error correction code is stored proximate the respective column or row to which it corresponds.

20. The method of claim 18, wherein the respective column or row comprises the respective error correction code.

21. The method of claim 18, wherein the error correction code is configured to correct a single bit error and to detect a double bit error within a respective column or row.

* * * * *

UNITED STATES PATENT AND TRADEMARK OFFICE
CERTIFICATE OF CORRECTION

PATENT NO. : 8,307,260 B2  Page 1 of 1
APPLICATION NO. : 13/365064
DATED : November 6, 2012
INVENTOR(S) : Yutaka Ito et al.

It is certified that error appears in the above-identified patent and that said Letters Patent is hereby corrected as shown below:

In column 11, line 67, in Claim 1, after "bit" insert -- string --.

In column 12, line 3, in Claim 1, delete "share" and insert -- shared --, therefor.

In column 12, line 4, in Claim 1, delete "and the" and insert -- and an --, therefor.

In column 12, line 7, in Claim 1, delete "string" and insert -- strings --, therefor.

In column 12, line 8, in Claim 1, delete "error,and" and insert -- error, and --, therefor.

In column 12, line 67, in Claim 12, delete "each," and insert -- each --, therefor.

Signed and Sealed this
Twenty-ninth Day of January, 2013

David J. Kappos
*Director of the United States Patent and Trademark Office*